US012772565B2

(12) United States Patent
Takechi

(10) Patent No.: US 12,772,565 B2
(45) Date of Patent: Oct. 20, 2026

(54) THIN-FILM TRANSISTOR SUBSTRATE

(71) Applicant: XIAMEN TIANMA DISPLAY TECHNOLOGY CO., LTD., Xiamen (CN)

(72) Inventor: Kazushige Takechi, Kawasaki (JP)

(73) Assignee: XIAMEN TIANMA DISPLAY TECHNOLOGY CO., LTD., Xiamen (CN)

( * ) Notice: Subject to any disclaimer, the term of this patent is extended or adjusted under 35 U.S.C. 154(b) by 380 days.

(21) Appl. No.: 18/519,703

(22) Filed: Nov. 27, 2023

(65) Prior Publication Data

US 2024/0178233 A1 May 30, 2024

(30) Foreign Application Priority Data

Nov. 28, 2022 (JP) ................................ 2022-189394

(51) Int. Cl.
*H10D 86/60* (2025.01)
*H10D 30/67* (2025.01)
*H10D 86/40* (2025.01)

(52) U.S. Cl.
CPC ......... *H10D 86/60* (2025.01); *H10D 30/6739* (2025.01); *H10D 30/6755* (2025.01); *H10D 30/6757* (2025.01); *H10D 86/423* (2025.01); *H10D 86/471* (2025.01)

(58) Field of Classification Search
None
See application file for complete search history.

(56) References Cited

U.S. PATENT DOCUMENTS

2011/0049507 A1 3/2011 Choi
2015/0123084 A1* 5/2015 Kim ..................... H10K 59/131 257/43
2017/0309649 A1* 10/2017 Hayashi ............... H10D 86/423
2018/0151114 A1* 5/2018 Choi ..................... H10D 86/481
2021/0013245 A1 1/2021 Tanaka et al.
2022/0005838 A1* 1/2022 Yamanaka ............. H10D 86/60

* cited by examiner

*Primary Examiner* — Hung K Vu
(74) *Attorney, Agent, or Firm* — NIXON & VANDERHYE

(57) ABSTRACT

A thin-film transistor substrate includes a first oxide semiconductor film, a second oxide semiconductor film located upper than the first oxide semiconductor film, a first insulating film located lower than the second oxide semiconductor film and covering the first oxide semiconductor film. The first oxide semiconductor film includes first and second low-resistive regions, and a channel region. Each of the first and second low-resistive regions includes a source/drain region. The second oxide semiconductor film includes third and fourth low-resistive regions, and a channel region of a second thin-film transistor. Each of the third and fourth low-resistive regions includes a source/drain region of the second thin-film transistor. A part of the first low-resistive region extending from a source/drain region of the first thin-film transistor is a bottom-gate electrode of the second thin-film transistor.

5 Claims, 11 Drawing Sheets

COMPARATIVE EXAMPLE

THIN-FILM TRANSISTOR SUBSTRATE

CROSS-REFERENCE TO RELATED APPLICATIONS

This non-provisional application claims priority under 35 U.S.C. § 119(a) on Patent Application No. 2022-189394 filed in Japan on Nov. 28, 2022, the entire content of which is hereby incorporated by reference.

BACKGROUND

This disclosure relates to a thin-film transistor substrate.

Thin-film transistors (TFTs) including an oxide semiconductor material such as indium-gallium-zinc-oxide (IGZO) are used in display devices including liquid crystal display panels and organic light-emitting diode (OLED) display devices and other kinds of devices. An oxide semiconductor TFT generates small leakage current and therefore, contributes to low power consumption of the device.

SUMMARY

An aspect of this disclosure is a thin-film transistor substrate including: a first oxide semiconductor film; a second oxide semiconductor film located upper than the first oxide semiconductor film; a first insulating film located lower than the second oxide semiconductor film and covering the first oxide semiconductor film; and a gate electrode of a first thin-film transistor. The first oxide semiconductor film includes a first low-resistive region, a second low-resistive region, and a channel region of the first thin-film transistor that is located between the first low-resistive region and the second low-resistive region and opposed to the gate electrode. Each of the first low-resistive region and the second low-resistive region includes a source/drain region of the first thin-film transistor. The second oxide semiconductor film includes a third low-resistive region, a fourth low-resistive region, and a channel region of a second thin-film transistor that is located between the third low-resistive region and the fourth low-resistive region. Each of the third low-resistive region and the fourth low-resistive region includes a source/drain region of the second thin-film transistor. A part of the first low-resistive region extending from a source/drain region of the first thin-film transistor is a bottom-gate electrode of the second thin-film transistor opposed to the channel region of the second thin-film transistor.

It is to be understood that both the foregoing general description and the following detailed description are exemplary and explanatory and are not restrictive of this disclosure.

EMBODIMENTS

Figure 1:
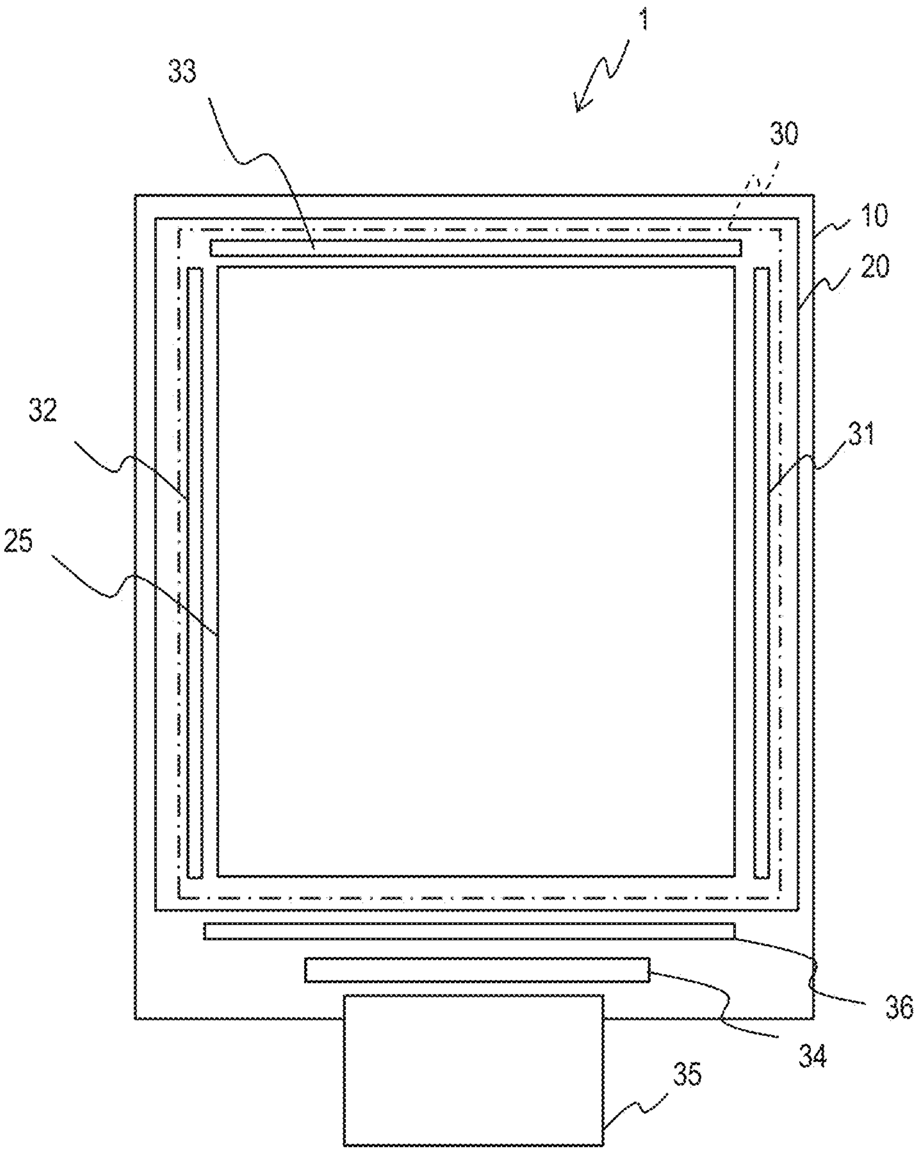
FIG. 1 illustrates a configuration example of an OLED display device related to an embodiment of this specification.

Hereinafter, embodiments of this disclosure will be described with reference to the accompanying drawings. It should be noted that the embodiments are merely examples to implement this disclosure and are not to limit the technical scope of this disclosure. Elements common to the drawings are denoted by the same reference signs and some elements in the drawings are exaggerated in size or shape for clear understanding of description.

Overview

Hereinafter, configurations of a thin-film transistor substrate (TFT substrate) including oxide semiconductor thin-film transistors of this disclosure are described. The TFT substrate in an embodiment of this specification is applicable to various devices such as sensor devices and display devices.

There are various demands, such as a demand for lower power consumption, a demand for smaller circuit size, and a demand for higher reliability. To satisfy such various demands, an aspect of this disclosure arrays oxide semiconductor TFTs including oxide semiconductor regions having different characteristics on the same substrate. The oxide semiconductor regions having different characteristics can be different in elemental composition. Being different in elemental composition means that the constituent elements are different or the constituent elements are the same but the composition distributions are different.

In an embodiment of this specification, the oxide semiconductor region of a first kind of oxide semiconductor TFT is located above and in contact with a first insulating layer and the oxide semiconductor region of a second kind of oxide semiconductor TFT is located above and in contact with a second insulating layer that is different from the first insulating layer. This configuration enables selection of appropriate oxide semiconductor materials to be used for the TFT substrate from many kinds of oxide semiconductor materials.

Oxide semiconductor TFTs exhibit low leakage current and low temperature-dependency. To attain a smaller circuit size, employment of an oxide semiconductor material having high mobility can be a solution. However, high-mobility oxide semiconductor materials are usually less reliable. To attain high reliability with an oxide TFT, employment of an oxide semiconductor material having a wide bandgap or low mobility can be a solution.

The characteristic to be weighted for an oxide semiconductor TFT depends on the function of the TFT in the circuit. For example, an oxide semiconductor TFT to be used as a switch can be made of an oxide semiconductor material having high mobility and an oxide semiconductor TFT for changing the amount of electric current in an analog manner can be made of an oxide semiconductor material having low mobility. In an example of a circuit for controlling light emission of a light-emitting element, the TFT for changing the amount of electric current in an analog manner adjusts the amount of driving current to be supplied to the light-emitting element in accordance with a data signal (control signal) supplied via a TFT working as a switch.

An embodiment of this specification uses a part of a low-resistive region of an oxide semiconductor film that includes a source/drain region of an oxide semiconductor TFT as an electrode of another circuit element. An embodiment of this specification uses a part of a low-resistive region of an oxide semiconductor film as a source/drain region of an oxide semiconductor TFT and uses another part as a gate electrode of another oxide semiconductor TFT.

The oxide semiconductor region of an oxide semiconductor TFT includes source/drain regions and a channel region therebetween. Each source/drain region is in contact with the channel region in an in-plane direction. The channel region has a higher resistance than the source/drain regions. The term "source/drain region" is a generic term of a source region or a drain region. A source/drain region can become a source region or a drain region depending on the direction of the flow of carriers in the channel region. In a configuration where a source/drain region is shared by two TFTs, the source/drain region can be the source region of one TFT and the drain region of the other TFT.

In an embodiment of this specification, a low-resistive region of an oxide semiconductor film includes a source/drain region of one oxide semiconductor TFT. The low-resistive region extends further from the source/drain region and includes a bottom-gate electrode of another oxide semiconductor TFT. The bottom-gate electrode is a gate electrode located under the oxide semiconductor region of an oxide semiconductor TFT or a gate electrode located closer to the substrate. This configuration eliminates a contact hole for connecting the source/drain region of the first oxide semiconductor TFT and the bottom-gate electrode of the second oxide semiconductor TFT.

Configuration of Display Device

FIG. 1 illustrates a configuration example of an organic light-emitting diode (OLED) display device 1 related to an embodiment of this specification. The OLED display device 1 includes a thin-film transistor (TFT) substrate 10 on which OLED elements and TFTs are fabricated, an encapsulation substrate 20 for encapsulating the OLED elements, and a bond (glass frit sealer) 30 for bonding the TFT substrate with the encapsulation substrate. The space between the TFT substrate 10 and the encapsulation substrate 20 is filled with dry nitrogen and sealed up with the bond 30. The encapsulation substrate 20 and the bond 30 constitute an example of a structural encapsulation unit. The structural encapsulation unit can have a thin film encapsulation (TFE) structure.

In the periphery outside a display region 25 of the TFT substrate 10, scanning drivers 31 and 32, a protection circuit 33, a driver IC 34, and a demultiplexer 36 are provided. The driver IC 34 is connected to the external devices via flexible printed circuits (FPC) 35. The scanning drivers 31 and 32 and the protection circuit 33 are peripheral circuits fabricated on the TFT substrate. The number of peripheral circuits can be different depending on the design.

For example, the scanning driver 31 drives scanning lines on the TFT substrate 10. The scanning driver 32 drives control lines to control the emission periods of pixels and to supply a reference potential to the pixels. The protection circuit 33 protects the elements in the pixel circuits from electrostatic discharge. The driver IC 34 provides power and timing signals (control signals) to the scanning drivers 31 and 32 and further, provides power and a data signal to the demultiplexer 36. The demultiplexer 36 changes the data line to output the data signal from the driver IC 34 d times per scanning period to drive d times as many data lines as output pins of the driver IC 34.

Configuration of TFT Substrate

Figure 2:
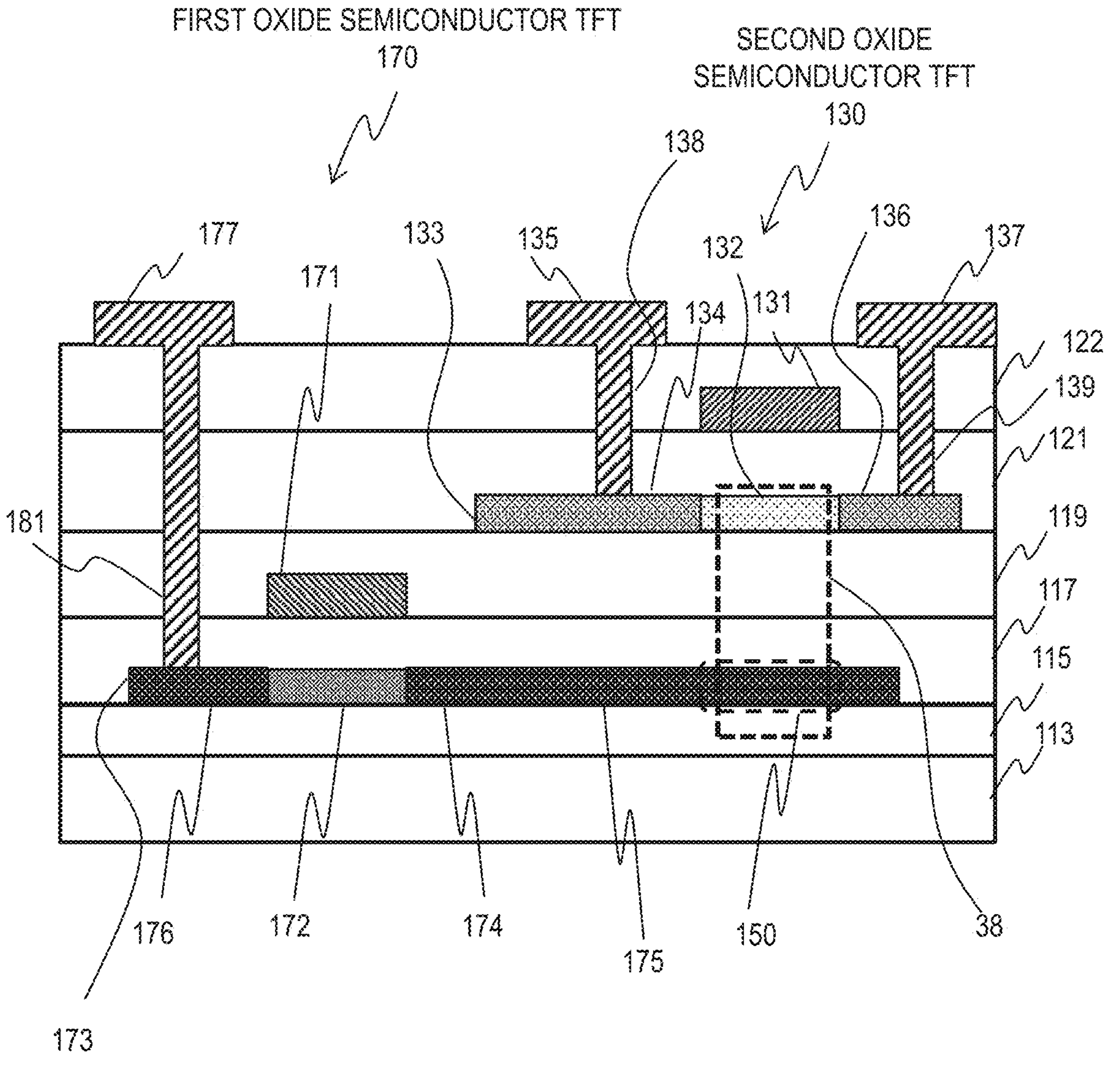
FIG. 2 schematically illustrates an example of the cross-sectional structure of a couple of oxide semiconductor TFTs that can be incorporated into a pixel circuit or a peripheral circuit on a TFT substrate.

FIG. 2 schematically illustrates an example of the cross-sectional structure of a couple of oxide semiconductor TFTs that can be incorporated into a pixel circuit or a peripheral circuit on a TFT substrate 10. These oxide semiconductor TFTs can be incorporated into a thin-film transistor circuit of a liquid crystal display device or another device.

FIG. 2 illustrates an example of a cross-sectional structure of a first oxide semiconductor TFT 170 and a second oxide semiconductor TFT 130. The second oxide semiconductor TFT 130 can be a driving TFT for adjusting the amount of driving current to an OLED element and the first oxide semiconductor TFT 170 can be a switching TFT for transferring a data signal (gate signal) to the gate electrode of the driving TFT 130.

The first oxide semiconductor TFT 170 and the second oxide semiconductor TFT 130 are fabricated on a flexible or inflexible insulating substrate 113 made of resin or glass. In the following description, the layer closer to the insulating substrate 113 between two layers layered in contact with each other (two layers having an interface) is a lower layer and the layer farther from the insulating substrate 113 is an upper layer.

The oxide semiconductor film (first oxide semiconductor film) 173 of the first oxide semiconductor TFT 170 and the oxide semiconductor film (second oxide semiconductor film) 133 of the second oxide semiconductor TFT 130 have different characteristics. In this example, the mobility of the second oxide semiconductor film 133 is lower than the mobility of the first oxide semiconductor film 173 and the bandgap of the first oxide semiconductor film 173 is narrower than the bandgap of the second oxide semiconductor film 133.

Examples of the oxide semiconductor material that can be used for the first oxide semiconductor film 173 include ITZO, IGZTO, In—Zn—Ti—O, and In—W—Z—O. Examples of the oxide semiconductor material that can be used for the second oxide semiconductor film 133 include IGZO, GaZnO, and IGO. The first oxide semiconductor film 173 and the second oxide semiconductor film 133 can be made of materials composed of the same kinds of elements (for example, IGZO) but having different composition distributions.

The oxide semiconductor film (first oxide semiconductor film) 173 of the first oxide semiconductor TFT 170 is provided above and in contact with a first insulating film 115. The oxide semiconductor film (second oxide semiconductor film) 133 of the second oxide semiconductor TFT 130 is provided above and in contact with a second insulating film 119. The second insulating film 119 is located upper than the first insulating film 115. The first oxide semiconductor film 173 is located lower than the second oxide semiconductor film 133.

In the configuration example in FIG. 2, the entire first oxide semiconductor film 173 is provided above and in contact with the first insulating film 115 and the entire second oxide semiconductor film 133 is provided above and in contact with the second insulating film 119.

An insulating film 117 is interposed between the first insulating film 115 and the second insulating film 119. The insulating film 117 is provided above and in contact with the oxide semiconductor film 173 and the first insulating film 115. The insulating film 117 covers at least a part of the oxide semiconductor film 173 and at least a part of the first insulating film 115. The second insulating film 119 is provided above and partially in contact with the insulating film 117.

The first oxide semiconductor TFT 170 includes an oxide semiconductor region of the first oxide semiconductor film 173, a top-gate electrode 171 located upper than the first oxide semiconductor film 173, and a gate insulating film located between the top-gate electrode 171 and the first oxide semiconductor film 173 in the layering direction. The gate insulating film is a part of the insulating film 117. The gate insulating film is in contact with and sandwiched by the undersurface of the top-gate electrode 171 and the top face of the oxide semiconductor film 173. The top-gate electrode 171 is covered with the second insulating film 119. A part of the second insulating film 119 is located above and in contact with the top face of the top-gate electrode 171.

The first oxide semiconductor film 173 includes the oxide semiconductor region of the first oxide semiconductor TFT 170. The oxide semiconductor region includes two source/drain regions 174 and 176 and a channel region 172 between the source/drain regions 174 and 176. The source/drain regions 174 and 176 are included in different low-resistive regions and the channel region 172 is included in a highly-resistive region. The channel region 172 is covered with the top-gate electrode 171 in the layering direction with the gate insulating film interposed therebetween. A source/drain electrode 177 includes a contact region 181 extending through insulating films 122, 121, 119, and 117 and being in contact with the top face of the source/drain region 176.

A low-resistive region 175 of the first oxide semiconductor film 173 extends from the source/drain region 174 toward the opposite side of the channel region 172 and a part of the low-resistive region 175 becomes a bottom-gate electrode 150 of the second oxide semiconductor TFT 130. This structure such that a part of the low-resistive region 175 of the first oxide semiconductor film 173 is the bottom-gate electrode of the second oxide semiconductor TFT 130 enables reduction in the number of contact holes.

The second oxide semiconductor TFT 130 includes an oxide semiconductor region of the second oxide semiconductor film 133, a top-gate electrode 131 located upper than the second oxide semiconductor film 133, and a gate insulating film located between the top-gate electrode 131 and the second oxide semiconductor film 133 in the layering direction. The gate insulating film is a part of the insulating film 121. The gate insulating film is in contact with and sandwiched by the undersurface of the top-gate electrode 131 and the top face of the oxide semiconductor film 133.

The insulating film 121 is located upper than the second insulating film 119 and the insulating film 122 is located upper than the insulating film 121. The insulating film 121 is located between the second insulating film 119 and the insulating film 122. The insulating film 121 is provided above and in contact with the oxide semiconductor film 133 and the second insulating film 119. The insulating film 121 covers at least a part of the oxide semiconductor film 133 and at least a part of the second insulating film 119. A part of the insulating film 121 is in contact with the second insulating film 119. The top-gate electrode 131 is covered with the insulating film 122. A part of the insulating film 122 is in contact with the top-gate electrode 131 and another part is in contact with the insulating film 121.

A source/drain electrode 135 includes a contact region 138 extending through the insulating films 122 and 121 and being in contact with the top face of a source/drain region 134. A source/drain electrode 137 includes a contact region 139 extending through the insulating films 122 and 121 and being in contact with the top face of a source/drain region 136.

The second oxide semiconductor film 133 includes the oxide semiconductor region of the second oxide semiconductor TFT 130. The oxide semiconductor region includes two source/drain regions 134 and 136 and a channel region 132 between the source/drain regions 134 and 136. The source/drain regions 134 and 136 are included in different low-resistive regions and the channel region 132 is included in a highly-resistive region. The channel region 132 is covered with the top-gate electrode 131 in the layering direction with the gate insulating film interposed therebetween.

As described above, a part of the low-resistive region 175 extending from the source/drain region 174 of the first oxide semiconductor TFT becomes a bottom-gate electrode 150 overlapping the channel region 132 of the second oxide semiconductor TFT. The bottom-gate electrode 150 is included in the low-resistive region 175 and opposed to the channel region 132 across a part of the layered insulating films 117 and 119. The part of the layered insulating films 117 and 119 is the gate insulating film of the bottom-gate electrode 150. This configuration provides the second oxide semiconductor TFT with a gentle Id-Vgs curve.

The insulating substrate 113 can be made of glass or flexible or rigid resin. An example of the resin is polyimide. The first insulating film 115 can be made of silicon nitride (SiNx), silicon oxide (SiOx), or layered films of these.

The oxide semiconductor film 173 can be made of ITZO, IGZTO, In—Zn—Ti—O, or In—W—Z—O. The low-resistive regions can be produced by implanting impurity ions (for example, boron ions) to the pertinent regions of the oxide semiconductor film across the insulating film 117, using the top-gate electrode 171 as a mask (self-alignment). This method attains a smaller ΔL, which is advantageous to downsize a TFT. The low-resistive regions can also be produced by exposing the pertinent regions to He plasma.

The insulating film 117, a part of which corresponds to the gate insulating film of the first oxide semiconductor TFT 170, can be made of silicon nitride (SiNx), silicon oxide (SiOx), or layered films of these. The top-gate electrode 171 can be made of any material; for example, it can be a single-layer film of a metal such as Mo, W, Nb, Al, Ta, Cr, or Ti, a layered film of metals selected from these, or an alloy of a metal selected from these. The second insulating film 119 covering the top-gate electrode 171 can be made of silicon nitride, silicon oxide, or layered films of these.

The oxide semiconductor film 133 provided above and in contact with the second insulating film 119 can be made of IGZO, GaZnO, or IGO. The low-resistive regions can be produced by implanting impurity ions (for example, boron ions) to the pertinent regions of the oxide semiconductor film across the insulating film 121, using the top-gate electrode 131 as a mask (self-alignment). This method attains a smaller ΔL, which is advantageous to downsize a TFT. The low-resistive regions can also be produced by exposing the pertinent regions to He plasma.

The insulating film 121, a part of which corresponds to the gate insulating film of the second oxide semiconductor TFT 130, can be made of silicon nitride, silicon oxide, or layered films of these. The top-gate electrode 131 can be made of any material; for example, it can be a single-layer film of a metal such as Mo, W, Nb, Al, Ta, Cr, or Ti, a layered film of metals selected from these, or an alloy of a metal selected from these. The insulating film 122 covering the top-gate electrode 131 can be made of silicon nitride, silicon oxide, or layered films of these.

The source/drain electrodes 135, 137, and 177 can be produced together using the same material. The source/drain electrode 135, 137, and 177 can have a multilayer structure of Ti/Al/Ti or Mo/Al/Mo. The source/drain electrode 135, 137, and 177 can have a single-layer structure or made of metal materials different from the aforementioned metal materials.

In the configuration example of FIG. 2, the low-resistive region including a source/drain region of the first oxide semiconductor TFT 170 is extended and a part of the extension becomes a bottom-gate electrode of the second oxide semiconductor TFT 130. A low-resistive region of an oxide semiconductor film is flatter and has less grain boundaries than a low-resistive region of a polysilicon film; accordingly, it provides the second oxide semiconductor TFT 130 with better characteristics.

Figure 3A:
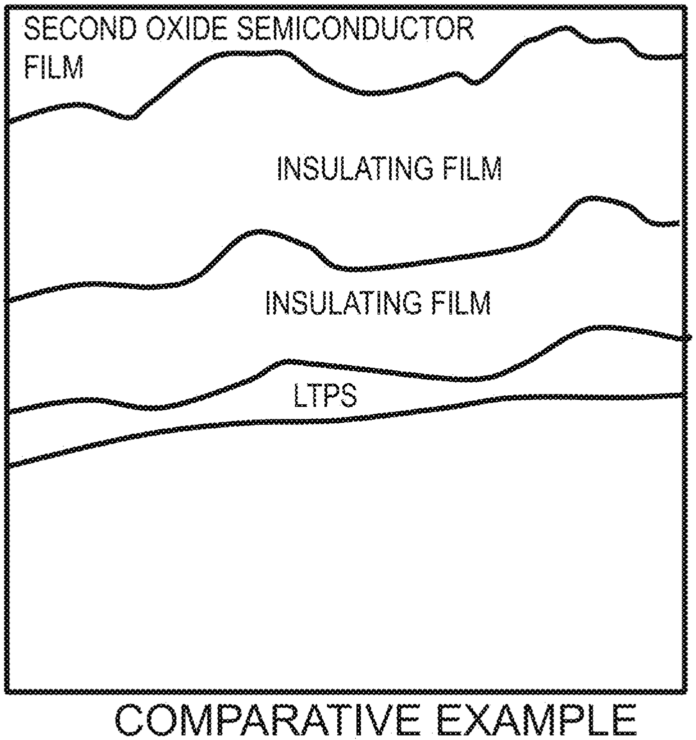
FIG. 3A schematically illustrates interfaces in a layered structure of a low-temperature polysilicon layer and two insulating films.
Figure 3B:
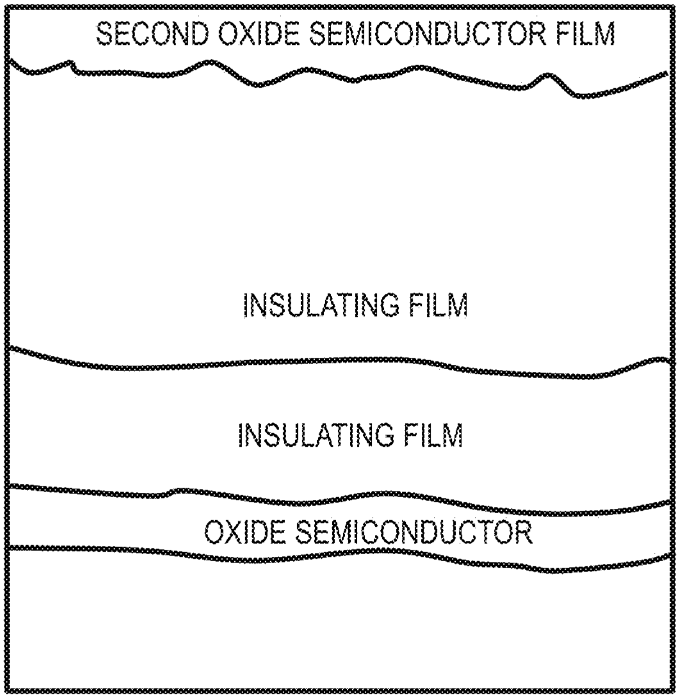
FIG. 3B schematically illustrates interfaces in a layered structure of an oxide semiconductor layer and two insulating films.

FIGS. 3A and 3B are enlarged schematic diagrams of the rectangular region 38 surrounded by a dashed line in FIG. 2. FIG. 3A provides a comparative example and schematically illustrates interfaces in a layered structure of a low-temperature polysilicon (LTPS) layer and two insulating films. FIG. 3B schematically illustrates interfaces in a layered structure of an oxide semiconductor layer and two insulating films.

As illustrated in FIG. 3A, the low-temperature polysilicon layer has a noticeably uneven top face and the insulating films deposited thereabove are wavy, following the shape of the low-temperature polysilicon layer. Furthermore, dense impurities such as H and C exist locally in grain boundaries of low-resistive polysilicon. For these reasons, if the first oxide semiconductor TFT 170 is replaced with a low-temperature polysilicon TFT, the second oxide semiconductor TFT 130 will be dominantly affected by the unevenness of its own channel interface and the impurities and degrade in its characteristics.

On the other hand, the oxide semiconductor film in FIG. 3B has a flat top face and the insulating films deposited thereabove are also flat, following the shape of the oxide semiconductor film. Furthermore, the oxide semiconductor substantially does not have grain boundaries or localized impurities. Accordingly, the second oxide semiconductor TFT 130 can avoid degradation in characteristics.

The configuration such that the bottom-gate insulating film of the second oxide semiconductor TFT 130 includes the lower insulating film 117 and the upper insulating film 119 sandwiching the top gate electrode of the first oxide semiconductor TFT 170 provides the second oxide semiconductor TFT 130 with a gentle Id-Vgs curve. On the other hand, the gate insulating film of the first oxide semiconductor TFT 170 is a part of the insulating film 117 and therefore, the first oxide semiconductor TFT 170 can have a high driving ability. Because of the employment of oxide semiconductor, the first oxide semiconductor TFT 170 can have a short channel (for example, shorter than 2 μm).

In the configuration example of FIG. 2, the first oxide semiconductor TFT 170 can include a bottom-gate electrode in place of or in addition to the top-gate electrode 171. In the case where the first oxide semiconductor TFT 170 does not have the top-gate electrode 171, the insulating film 119 or 117 can be excluded. The top-gate electrode 131 of the second oxide semiconductor TFT 130 can also be excluded.

Configuration of TFT Substrate in Pixel Circuit

Figure 4:
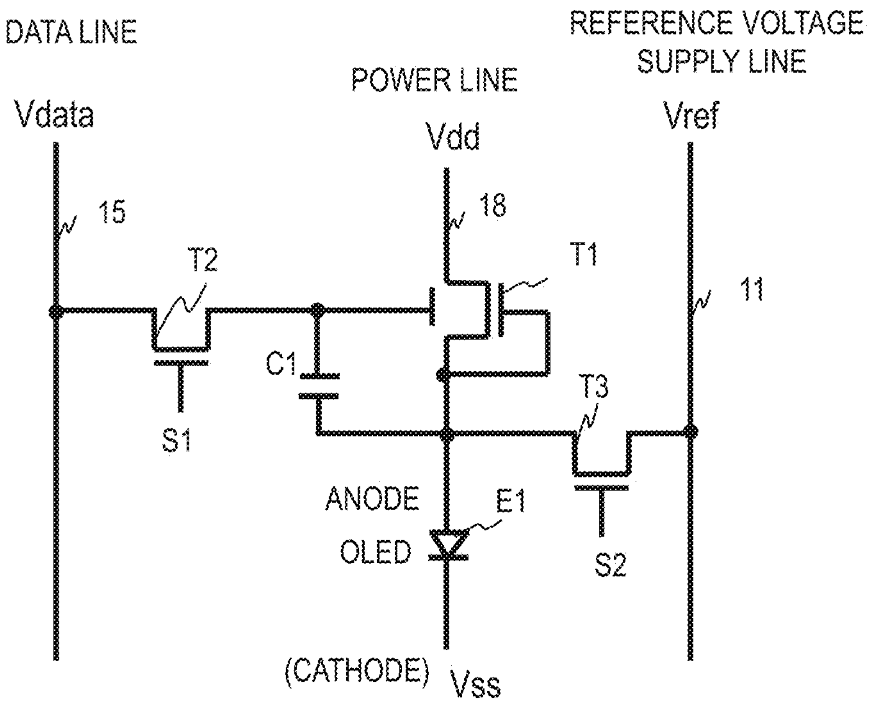
FIG. 4 illustrates a configuration example of a pixel circuit of an OLED display device.

FIG. 4 illustrates a configuration example of a pixel circuit of an OLED display device 1. The pixel circuit controls electric current to be supplied to the anode electrode of the OLED element E1. The pixel circuit includes a driving transistor T1, a selection transistor T2, a control transistor T3, and a storage capacitor C1. The pixel circuit controls light emission of the OLED element E1. The transistors T1 to T3 in the example of FIG. 4 are n-channel type of oxide semiconductor TFTs.

The selection transistor T2 is a switch for selecting the pixel. The gate terminal of the selection transistor T2 receives a scanning signal S1. One of its source/drain terminals is connected to a data line 15. The other source/drain terminal is connected to the first gate terminal of the driving transistor T1. The second gate terminal of the driving transistor T1 is connected to the source terminal of the driving transistor T1.

The driving transistor T1 is a transistor for driving the OLED element E1. The first gate terminal of the driving transistor T1 is connected to a source/drain terminal of the selection transistor T2. The drain terminal of the driving transistor T1 is connected to a power line (Vdd) 18. The source terminal is connected to the second gate terminal and a source/drain terminal of the control transistor T3. The storage capacitor C1 is provided between the first gate terminal and the source terminal of the driving transistor T1.

When the selection transistor T2 is turned on, the data voltage supplied through the data line 15 is stored to the storage capacitor C1. The storage capacitor C1 holds the stored voltage throughout the period of one frame. The conductance of the driving transistor T1 changes in an analog manner in accordance with the stored voltage, so that the driving transistor T1 supplies a forward bias current corresponding to an emission level to the OLED element E1.

The control transistor T3 controls the electric connection between the reference voltage supply line 11 for supplying a reference voltage Vref and the anode of the OLED element E1. A control signal S2 is supplied to the gate terminal of the control transistor T3 for this control. The control transistor T3 can be used for various purposes. The control transistor T3 can be used to reset the anode electrode of the OLED element E1 once to a sufficiently low voltage that is lower than the black signal level in order to prevent crosstalk between OLED elements E1 caused by the leakage current.

The control transistor T3 can also be used to measure a characteristic of the driving transistor T1. For example, the voltage-current characteristic of the driving transistor T1 can be accurately measured by measuring the current flowing from the power line 18 to the reference voltage supply line 11 under the bias conditions selected so that the driving transistor T1 will operate in the saturated region and the control transistor T3 will operate in the linear region. If the differences in voltage-current characteristic among the driving transistors T1 for individual pixels are compensated for by generating data signals at an external circuit, a highly-uniform display image can be attained.

In the meanwhile, the voltage-current characteristic of the OLED element E1 can be accurately measured by applying a voltage to light the OLED element E1 from the reference voltage supply line 11 when the driving transistor T1 is off and the control transistor T3 is operating in the linear region. In the case where the OLED element E1 is deteriorated because of long-term use, for example, if the deterioration is compensated for by generating a data signal at an external circuit, the display device can have a long life spun. FIG. 4 illustrates merely an example of a pixel circuit; the features of this specification are applicable to a pixel circuit having any other configuration.

Figure 5:
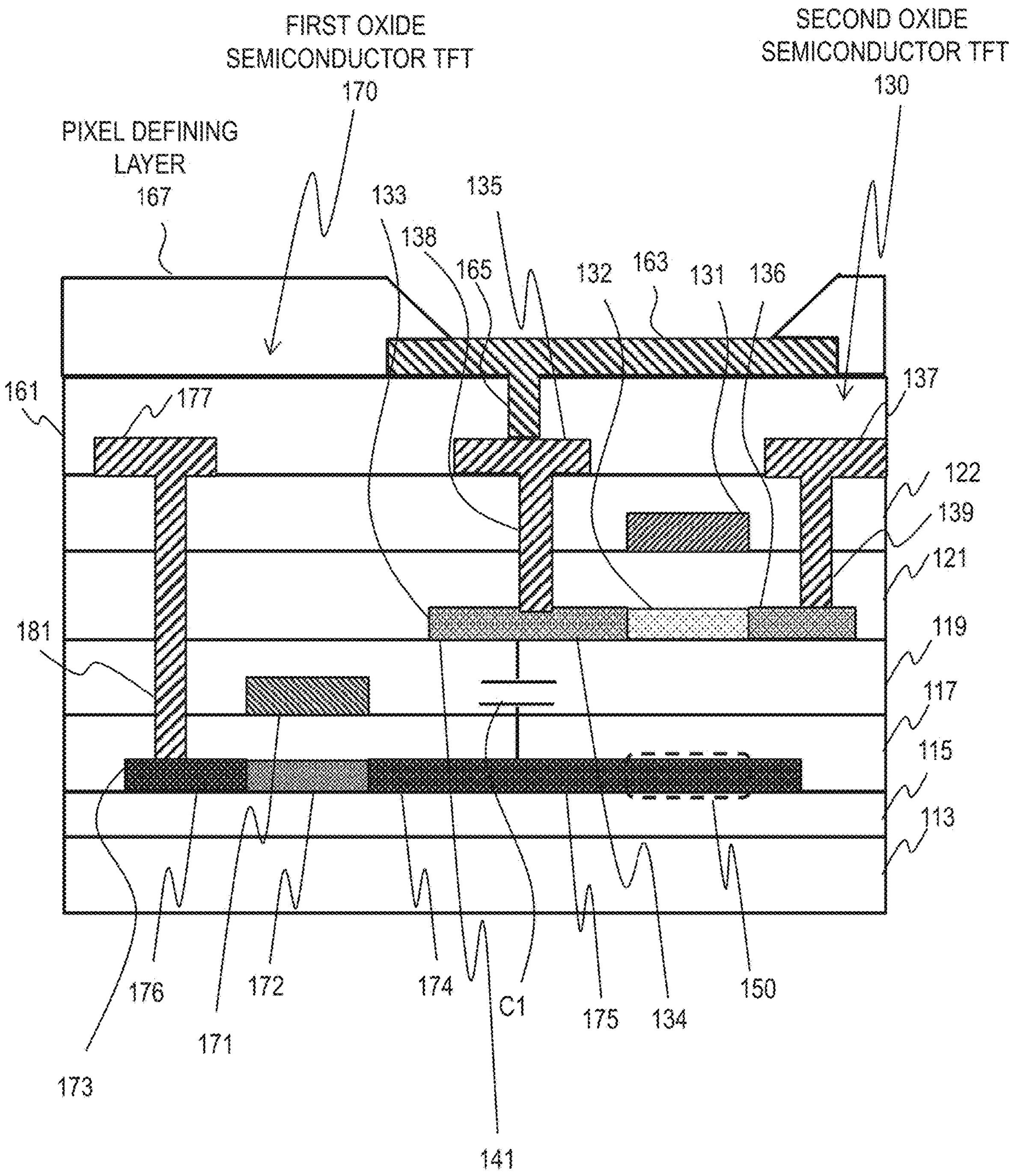
FIG. 5 schematically illustrates an example of the cross-sectional structure of a couple of oxide semiconductor TFTs that can be incorporated into the pixel circuit in FIG. 4.

FIG. 5 schematically illustrates an example of the cross-sectional structure of a couple of oxide semiconductor TFTs that can be incorporated into the pixel circuit in FIG. 4. FIG. 5 is a cross-sectional diagram schematically illustrating a device structure of the transistors T1 and T2 and the storage capacitor C1 in FIG. 4. The first oxide semiconductor TFT 170 corresponds to the transistor T2 and the second oxide semiconductor TFT 130 corresponds to the transistor T1. The bottom-gate electrode 150 of the second oxide semiconductor TFT 130 corresponds to the first gate terminal of the transistor T1 and the top-gate electrode 131 corresponds to the second gate terminal.

Hereinafter, elements other than the elements shown in FIG. 4 are mainly described with reference to FIG. 5. A planarization film 161 is provided above the source/drain electrodes 135, 137, and 177 and an insulating film 122. The planarization film 161 can be made of a coatable organic material having a good flatness, such as acrylic or polyimide. An anode electrode 163 is provided above and in contact with the planarization film 161.

The anode electrode 163 is connected to the source/drain electrode (source terminal) 135 of the second oxide semiconductor TFT 130 via a contact region 165 extending through the planarization film 161. The anode electrode 163 can be a layered film of ITO and a metal having high reflectivity such as aluminum or silver.

A pixel defining layer 167 is provided above the anode electrode 163. The pixel defining layer 167 can be an organic film made of acrylic or polyimide. A part of the anode electrode 163 is exposed within an opening of the pixel defining layer 167; a multilayer organic film and a cathode electrode, which are not shown in FIG. 5, are layered above the anode electrode 163. The organic film emits light in response to electric current supplied thereto. The cathode electrode of each pixel is a part of one conductive film and is supplied with a common cathode power supply potential. The cathode electrode can be made of ITO.

As to the upper oxide semiconductor film 133, at least a part of the low-resistive region 141 including the source/drain region 134 is opposed to at least a part of the low-resistive region 175 of the lower oxide semiconductor film 173. At least a part of the storage capacitor C1 is configured in this region.

Figure 6A:
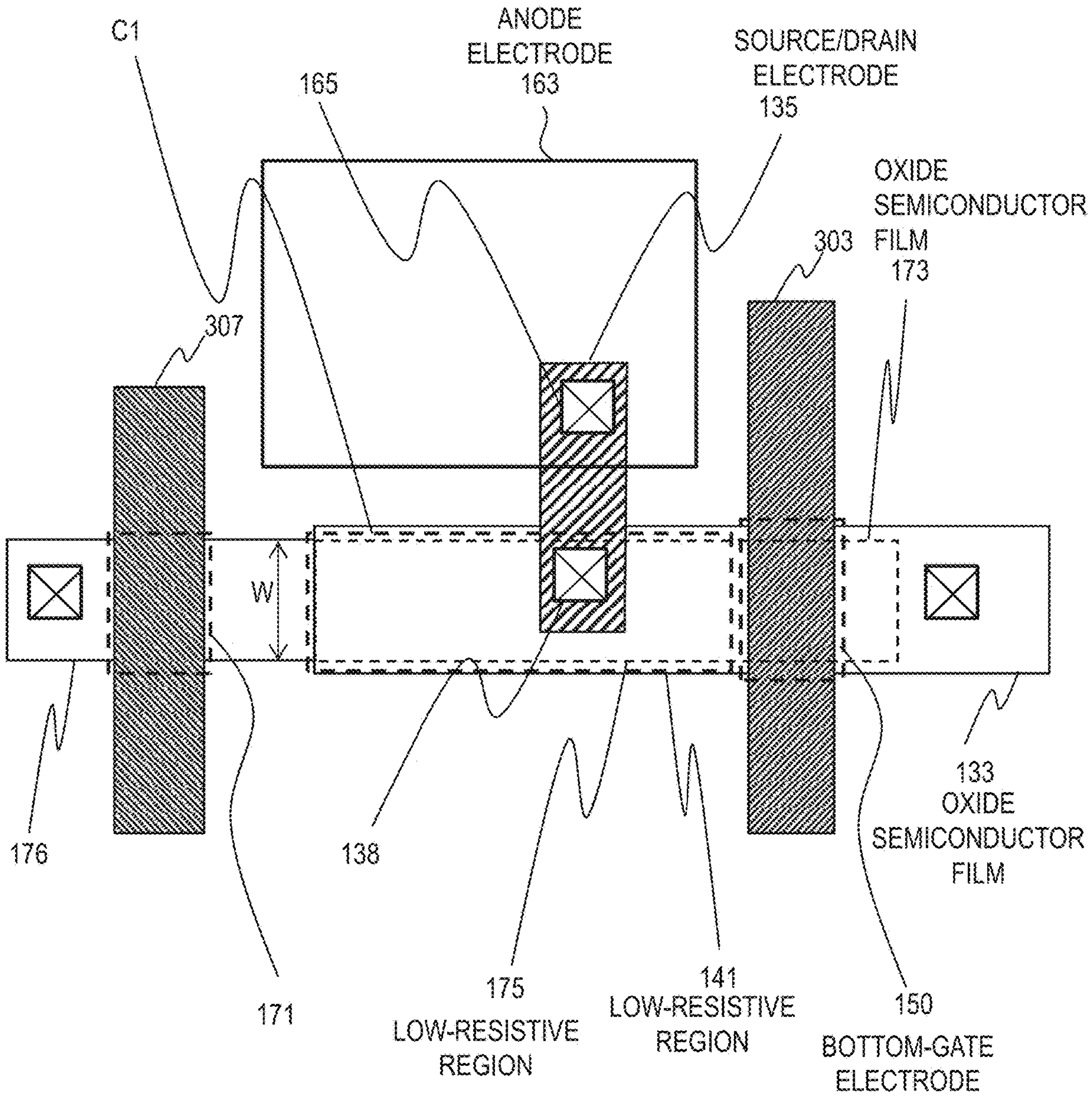
FIG. 6A is a plan diagram illustrating some elements shown in FIG. 5.

FIG. 6A is a plan diagram illustrating some elements shown in FIG. 5. In the configuration example in FIG. 5, the top-gate electrode 131 of the second oxide semiconductor TFT 130 is not connected to the source/drain electrode 135. The top-gate electrode 131 is supplied with a predetermined potential through a path around the source/drain electrode 135.

A part of a conductor film 307 corresponds to the top-gate electrode 171 of the first oxide semiconductor TFT 170. The top-gate electrode 171 is an overlap region of the conductor film 307 with the channel region (the highly-resistive region, not shown in FIG. 6A) of the oxide semiconductor film 173.

The bottom-gate electrode 150 is a part of the low-resistive region 175 of the oxide semiconductor film 173 that is opposed to the channel region of the upper oxide semiconductor film 133. Although not provided with a reference sign in FIG. 6A, the top-gate electrode 131 of the second oxide semiconductor TFT 130 can be an overlap region of the conductor film 303 with the bottom-gate electrode 150 when viewed planarly.

The low-resistive region 175 of the lower oxide semiconductor film 173 partially overlaps the low-resistive region 141 of the upper oxide semiconductor film 133 when viewed planarly. Apart of the storage capacitor C1 is configured in this overlap region. This configuration using the low-resistive region 175 of the lower oxide semiconductor film 173 as an electrode of the storage capacitor enables the circuit to have a smaller area.

In the configuration example of FIG. 6A, the low-resistive regions 175 and 141 have shapes like strips extending in a horizontal direction in FIG. 6A. The low-resistive regions 175 and 141 extend in the direction crossing the conductor films 303 and 307. In the overlap region of the low-resistive regions 175 and 141 in a planar view, the width W of the low-resistive region 175 is smaller than the width of the low-resistive region 141. When this region is viewed planarly, the ends of the low-resistive region 175 defining the width W are covered with the low-resistive region 141. The width is the size in the vertical direction in FIG. 6A.

Figure 6B:
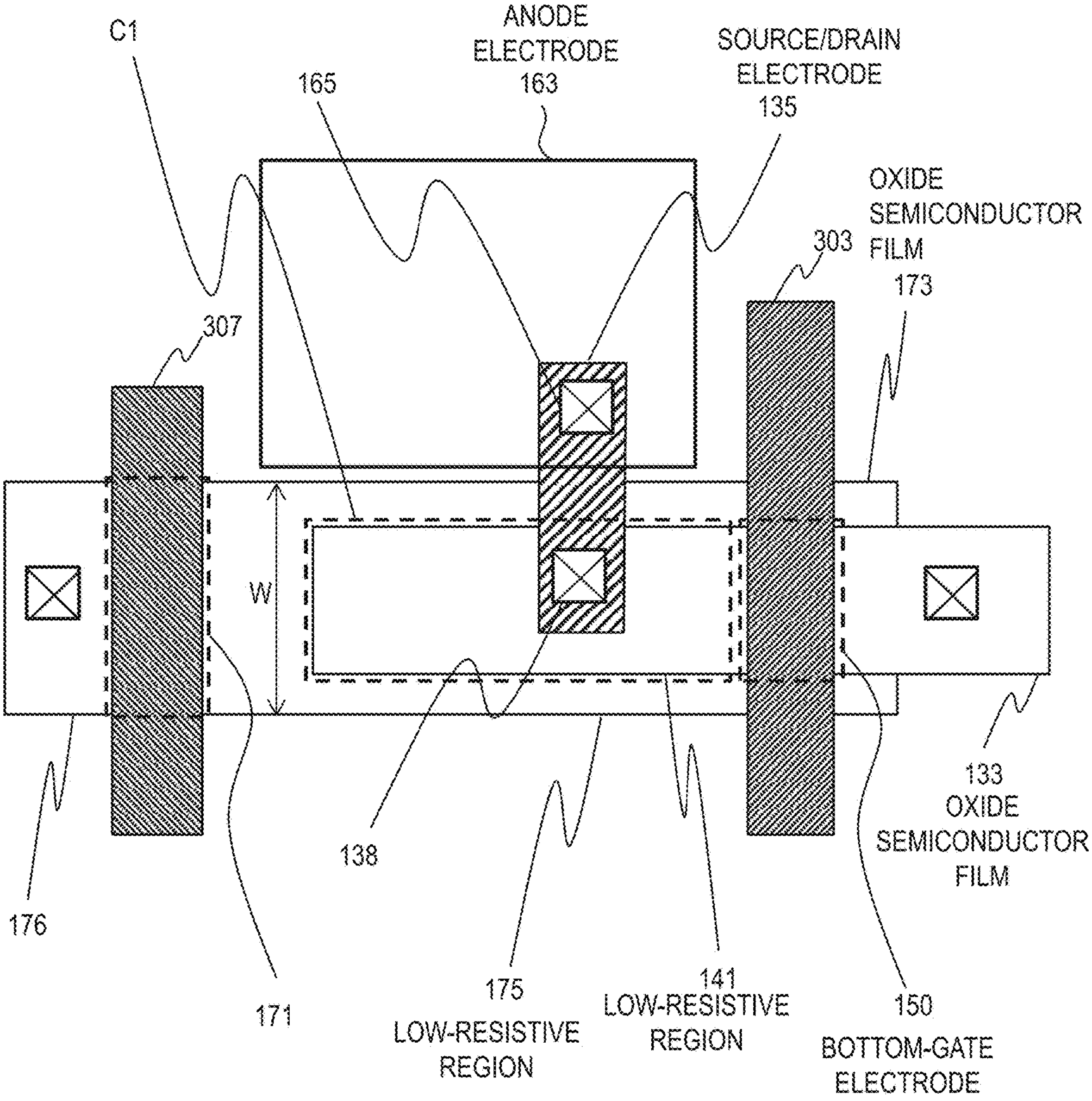
FIG. 6B is another plan diagram illustrating some elements shown in FIG. 5.

FIG. 6B is another plan diagram illustrating some elements shown in FIG. 5. Compared to the configuration example in FIG. 6A, the first oxide semiconductor TFT 170 has a larger channel width than the second oxide semiconductor TFT 130. The width W of the oxide semiconductor film 173 and the low-resistive region 175 is large. In the overlap region of the low-resistive regions 175 and 141 in a planar view, the width W of the low-resistive region 175 is larger than the width of the low-resistive region 141. When this region is viewed planarly, the ends of the low-resistive region 141 defining the width are included in the low-resistive region 175. Accordingly, a larger overlap region of the low-resistive regions 175 and 141 in a planar view is attained, so that the storage capacitor C1 can have a larger area.

Figure 7:
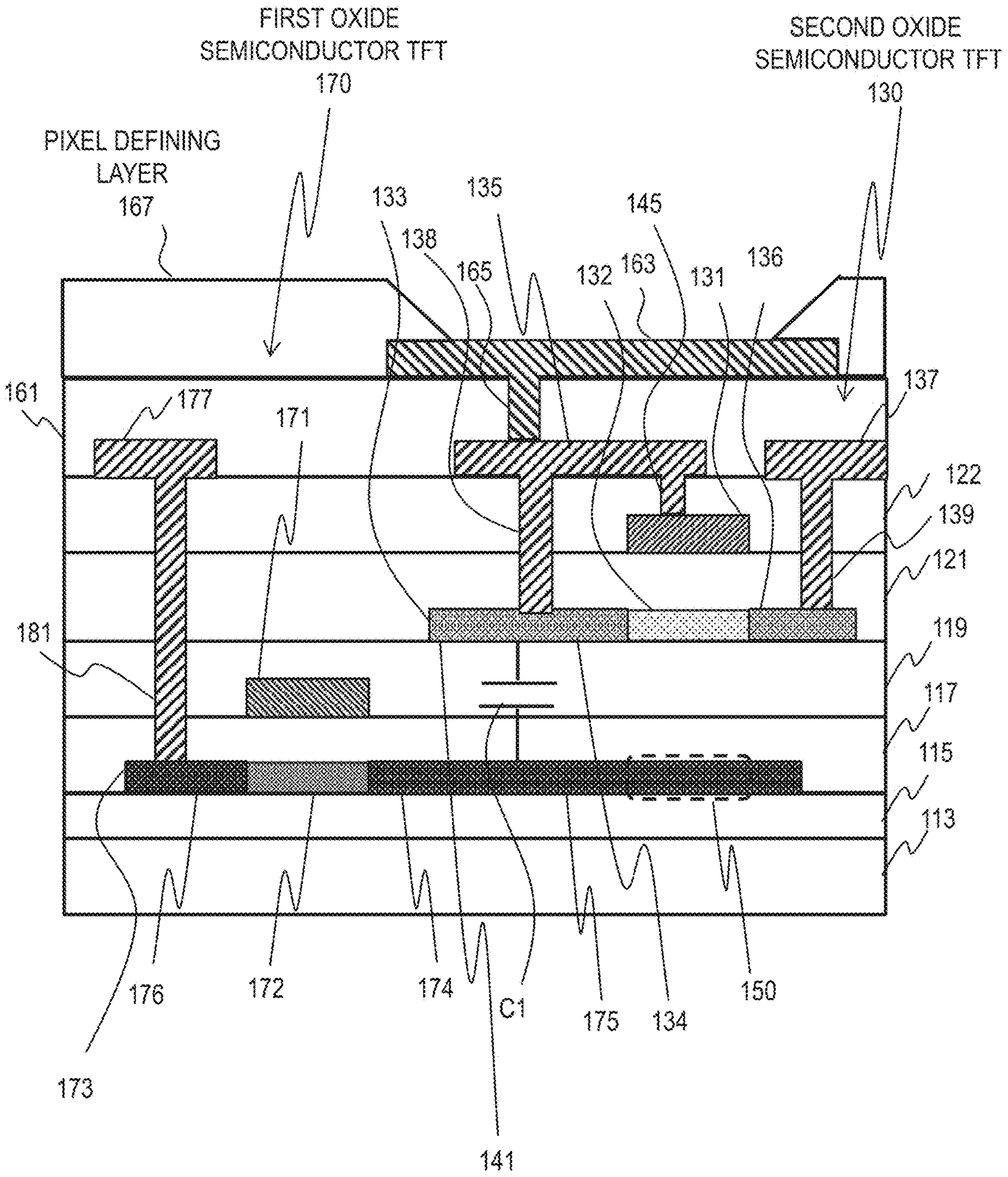
FIG. 7 schematically illustrates another example of the cross-sectional structure of a couple of oxide semiconductor TFTs that can be incorporated into the pixel circuit in FIG. 4.

FIG. 7 schematically illustrates another example of the cross-sectional structure of a couple of oxide semiconductor TFTs that can be incorporated into the pixel circuit in FIG. 4. Differences from the configuration example in FIG. 5 are mainly described. In this configuration example, the top-gate electrode 131 of the second oxide semiconductor TFT 130 is connected to the source/drain electrode 135. The source/drain electrode 135 in the configuration example of FIG. 7 is connected to the top-gate electrode 131 via a contact region 145 that extends through the insulating film 122 and is in contact with the top face of the top-gate electrode 131. Accordingly, the source/drain electrode 135 and the top-gate electrode 131 are at the same potential.

Figure 8:
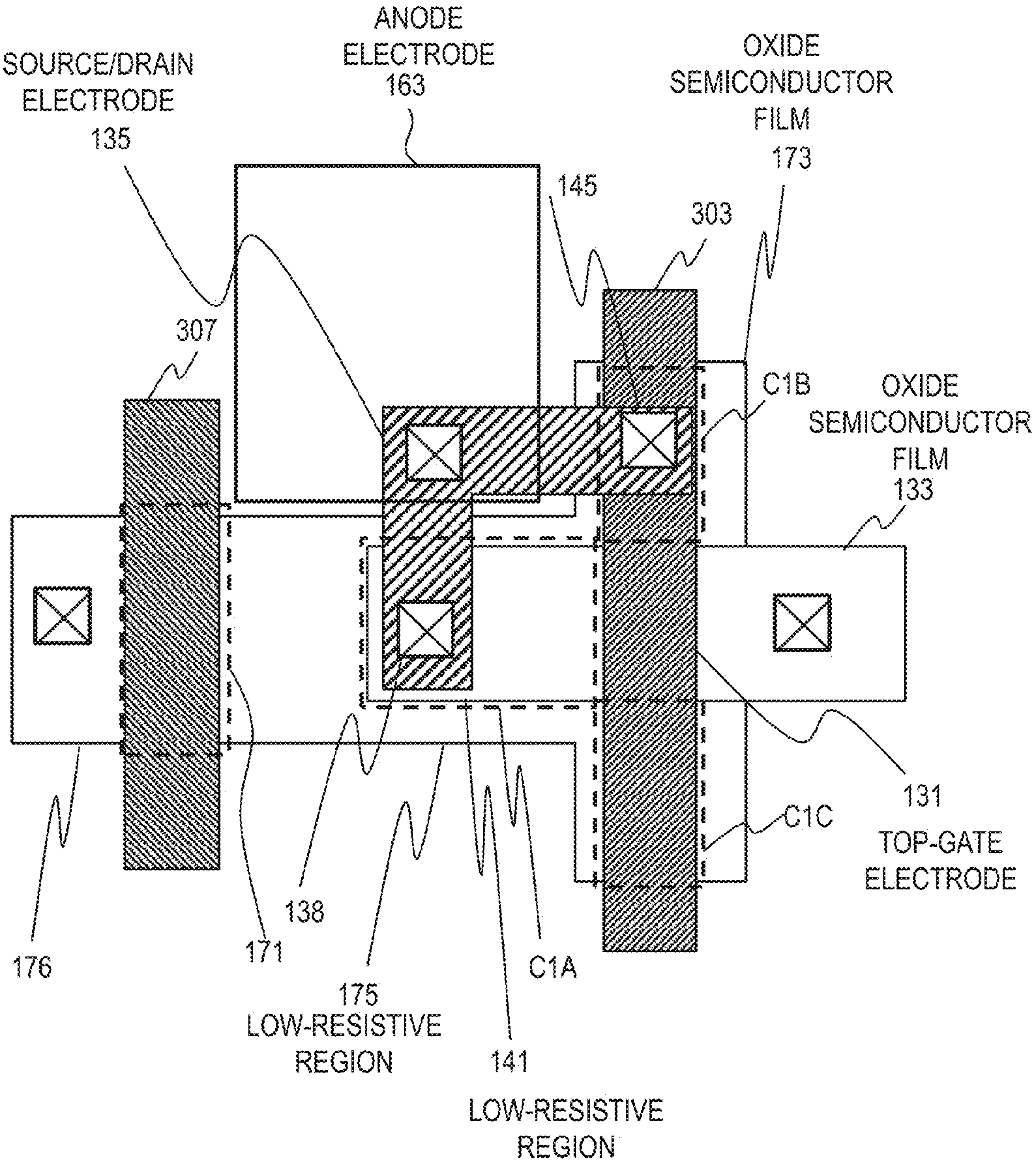
FIG. 8 is a plan diagram illustrating some elements shown in FIG. 7.

FIG. 8 is a plan diagram illustrating some elements shown in FIG. 7. Differences from the configuration example of FIG. 6A or 6B are mainly described. As described with reference to FIG. 7, the source/drain electrode 135 of the second oxide semiconductor TFT 130 is connected to the top-gate electrode 131 via the contact region 145. In this example, the contact region 145 is in contact with the top face of the conductor film 303 including the top-gate electrode 131 and the contact point is located outside the top face of the top-gate electrode 131. The top-gate electrode 131 is the overlap region of the conductor film 303 with the channel region (highly-resistive region) of the second oxide semiconductor TFT 130.

This configuration example includes not only the capacitor configured with the opposed low-resistive regions of two oxide semiconductor films 133 and 173 but also other capacitors included in the storage capacitor C1. Specifically, the capacitor C1A is a capacitor using a part of the low-resistive region 175 of the oxide semiconductor film 173 as a lower electrode and a part of the low-resistive region 141 of the oxide semiconductor film 133 as an upper electrode. The insulating films 117 and 119 are interposed between these electrodes.

The capacitors C1B and C1C are capacitors each using a part of the low-resistive region 175 of the oxide semiconductor film 173 as a lower electrode and a part of the conductor film 303 including the top-gate electrode 131 as an upper electrode. The insulating films 117, 119, and 121 are interposed between these electrodes. The capacitors C1A, C1B, and C1C are separate without an overlap in a planar view and they are parallel to one another in the circuit.

In the configuration example of FIG. 8, the overlap region of the oxide semiconductor film 173 with the conductor film 303 extends along the conductor film 303. For example, the size in the channel width direction (the vertical direction in FIG. 8) of the overlap region of the oxide semiconductor film 173 with the conductor film 303 is larger than the size in the same direction of the oxide semiconductor film 173 at the contact region 138. This configuration enables the capacitors C1B and C1C to have larger sizes. The total area in which the conductor film 303 is opposed to the low-resistive region 175 across a plurality of insulating films can be larger than the channel region of the second oxide semiconductor TFT 130.

Other Configuration Examples

Figure 9:
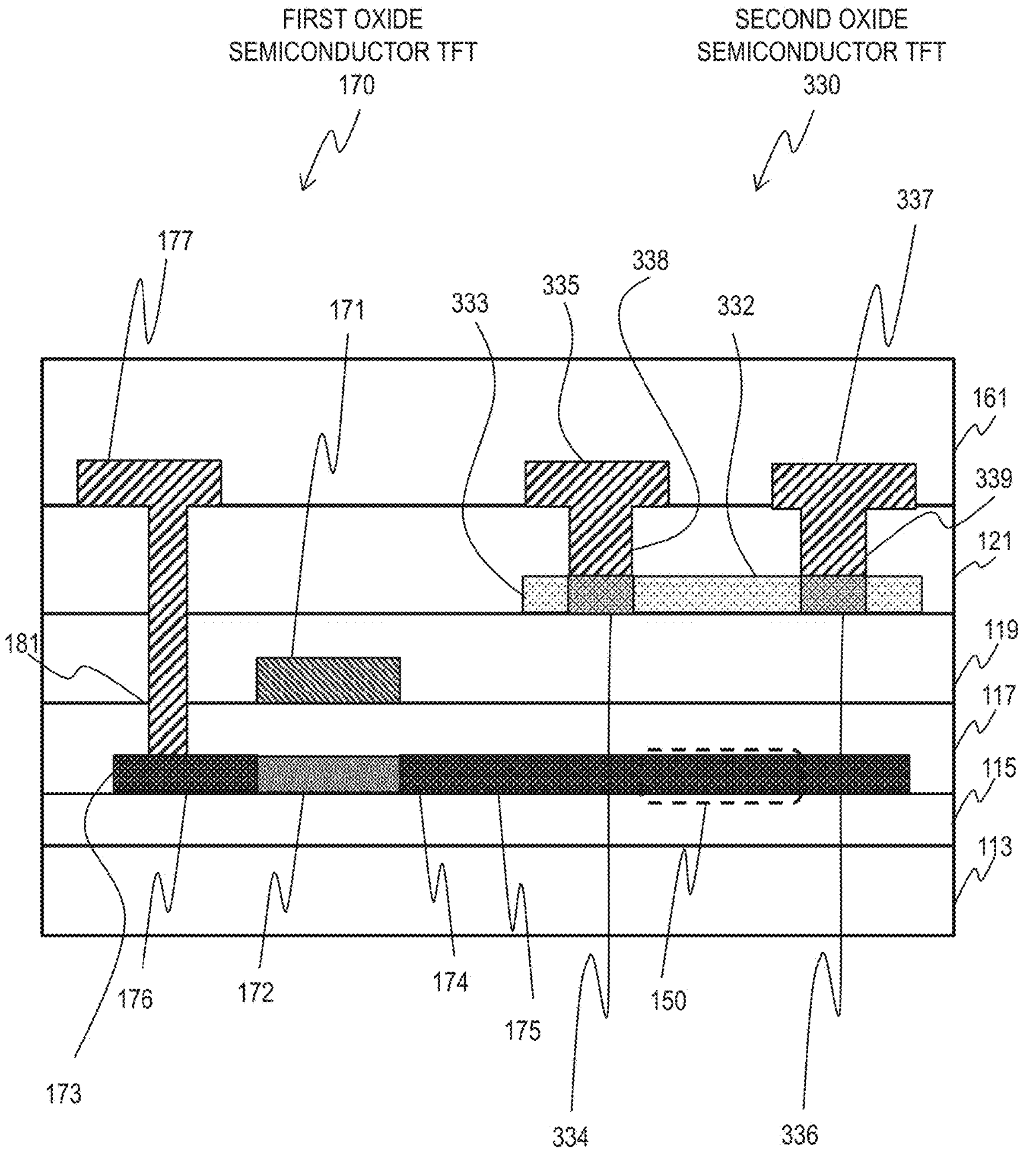
FIG. 9 schematically illustrates another example of the cross-sectional structure of a couple of oxide semiconductor TFTs.

Other configuration examples of the second oxide semiconductor TFT are described. FIG. 9 schematically illustrates another example of the cross-sectional structure of a couple of oxide semiconductor TFTs. In the following, differences from the configuration example of FIG. 2 are mainly described. The configuration of the first oxide semiconductor TFT 170 is common to the two configuration examples. In comparison with the configuration example of FIG. 2, the configuration example of FIG. 9 does not include the insulating film 122 and therefore, the upper end of the source/drain electrode 177 is in contact with the top face of the insulating film 121.

The upper second oxide semiconductor TFT 330 does not have a top-gate electrode and accordingly, it is a bottom-gate TFT having only a bottom-gate electrode. The second oxide semiconductor TFT 330 is an etch-stop layer (ESL) type TFT.

The second oxide semiconductor TFT 330 includes an oxide semiconductor region of a second oxide semiconductor film 333 provided above and in contact with the second insulating film 119. The oxide semiconductor region of the second oxide semiconductor film 333 includes source/drain regions 334 and 336 and a channel region 332 therebetween. End faces of the channel region 332 are in contact with end faces of the source/drain regions 334 and 336 in an in-plane direction.

A source/drain electrode 335 includes a contact region 338 extending through the insulating film 121 and being in contact with the top face of the source/drain region 334. A source/drain electrode 337 includes a contact region 339 extending through the insulating film 121 and being in contact with the top face of the source/drain region 336. The channel region 332 is covered with the insulating film 121. Accordingly, in etching the insulating film 121 to form the source/drain electrodes 335 and 337, the channel region 332 can be free from exposure to the etchant. The first oxide semiconductor TFT 170 and the second oxide semiconductor TFT 330 are covered with a planarization film 161.

Figure 10:
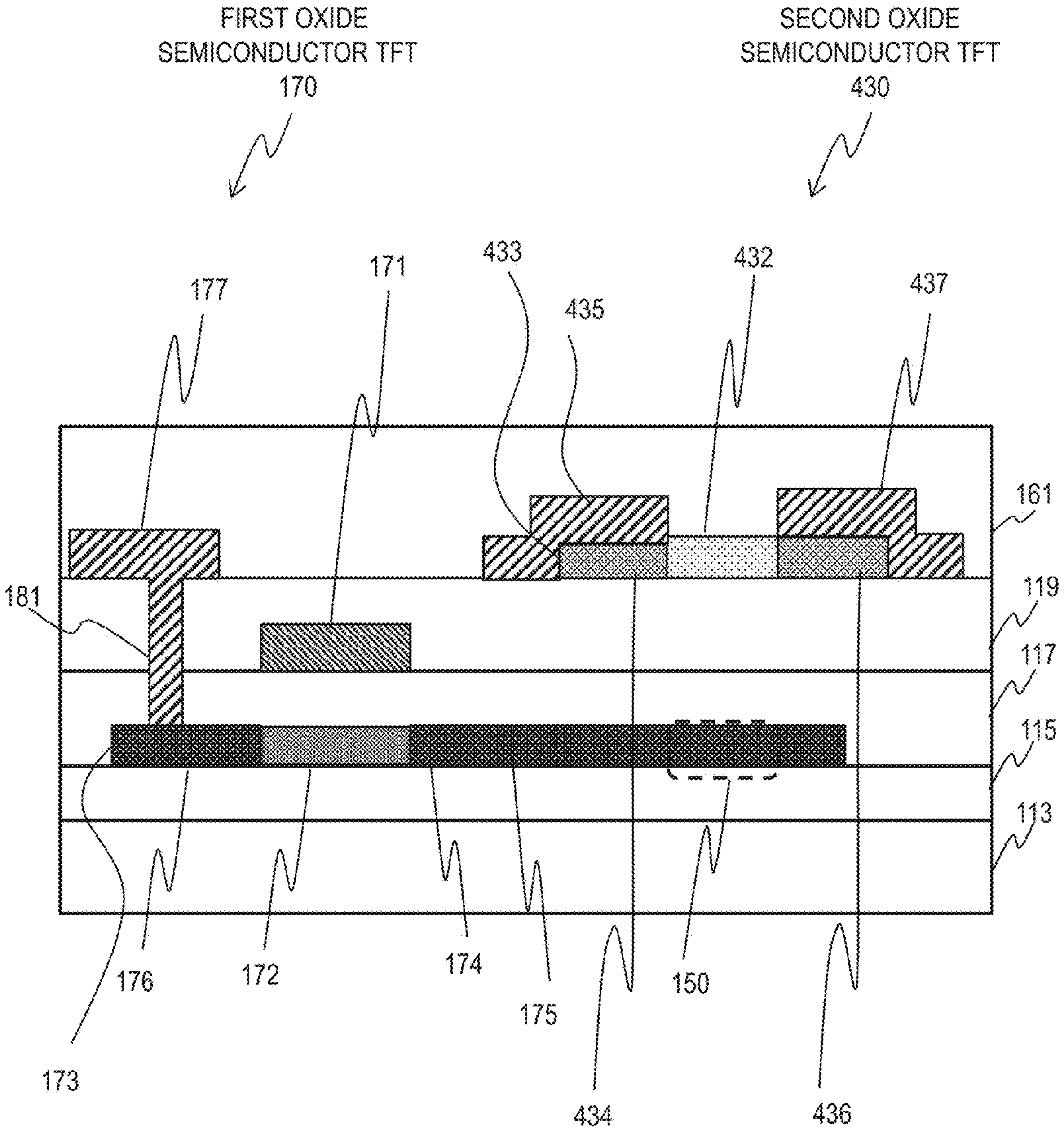
FIG. 10 schematically illustrates still another example of the cross-sectional structure of a couple of oxide semiconductor TFTs.

FIG. 10 schematically illustrates still another example of the cross-sectional structure of a couple of oxide semiconductor TFTs. In the following, differences from the configuration example of FIG. 2 are mainly described. The configuration of the first oxide semiconductor TFT 170 is common to the two configuration examples. In comparison with the configuration example of FIG. 2, the configuration example of FIG. 10 does not include the insulating films 121 and 122 and therefore, the upper end of the source/drain electrode 177 is in contact with the top face of the insulating film 119.

The upper second oxide semiconductor TFT 430 does not have a top-gate electrode and accordingly, it is a bottom-gate TFT having only a bottom-gate electrode. The second oxide semiconductor TFT 430 is a back-channel-etched (BCE) type TFT.

The second oxide semiconductor TFT 430 includes an oxide semiconductor region of a second oxide semiconductor film 433 provided above and in contact with the second insulating film 119. The oxide semiconductor region of the second oxide semiconductor film 433 includes source/drain regions 434 and 436 and a channel region 432 therebetween. End faces of the channel region 432 are in contact with end faces of the source/drain regions 434 and 436 in an in-plane direction.

A source/drain electrode 435 is located in contact with the top face and a side face of the source/drain region 434 without an insulating film interposed therebetween. A part of the source/drain electrode 435 is located above and in contact with the insulating film 119. A source/drain electrode 437 is located in contact with the top face and a side face of the source/drain region 436 without an insulating film interposed therebetween. A part of the source/drain electrode 437 is located above and in contact with the insulating film 119. A planarization film 161 is provided in contact with the source/drain electrodes 435 and 437 and also the channel region 432 to cover them.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A thin-film transistor substrate comprising:

a first oxide semiconductor film;

a second oxide semiconductor film located upper than the first oxide semiconductor film;

a first insulating film located lower than the second oxide semiconductor film and covering the first oxide semiconductor film; and a gate electrode of a first thin-film transistor, a second insulating film located upper than the first insulating film, and a conductor film including a top-gate electrode of the second thin-film transistor, wherein the first oxide semiconductor film includes a first low-resistive region, a second low-resistive region, and a channel region of the first thin-film transistor that is located between the first low-resistive region and the second low-resistive region and opposed to the gate electrode, wherein each of the first low-resistive region and the second low-resistive region includes a source/drain region of the first thin-film transistor, wherein the second oxide semiconductor film includes a third low-resistive region, a fourth low-resistive region, and a channel region of a second thin-film transistor that is located between the third low-resistive region and the fourth low-resistive region, wherein each of the third low-resistive region and the fourth low-resistive region includes a source/drain region of the second thin-film transistor, wherein a part of the first low-resistive region extending from the source/drain region of the first thin-film transistor is a bottom-gate electrode of the second thin-film transistor opposed to the channel region of the second thin-film transistor, wherein the gate electrode of the first thin-film transistor is a top-gate electrode, wherein the second insulating film covers the top-gate electrode, wherein a part of the first insulating film is located between the top-gate electrode and the channel region of the first thin-film transistor and another part of the first insulating film is located between the bottom-gate electrode and the channel region of the second thin-film transistor, wherein a part of the second insulating film is located between the bottom-gate electrode and the channel region of the second thin-film transistor, wherein another part of the first low-resistive region extending from the source/drain region of the first thin-film transistor is opposed to a part of the third low-resistive region with a multilayer insulating film including the first insulating film and the second insulating film interposed therebetween to configure a first capacitive element, wherein the conductor film is connected to the third low-resistive region, and wherein a part of the first low-resistive region is opposed to a part of the conductor film with an insulating film interposed therebetween to configure a second capacitive element in parallel to the first capacitive element.

2. The thin-film transistor substrate according to claim 1, wherein the first thin-film transistor is a switching transistor, and wherein the second thin-film transistor is a transistor configured to adjust an amount of electric current in a channel region in accordance with a control signal.

3. The thin-film transistor substrate according to claim 2, wherein the channel region of the second thin-film transistor has lower mobility than the channel region of the first thin-film transistor.

4. The thin-film transistor substrate according to claim 1, wherein the first oxide semiconductor film and the second oxide semiconductor film are different in material or composition distribution.

5. The thin-film transistor substrate according to claim 1, wherein the channel region of the first thin-film transistor has a larger width than the channel region of the second thin-film transistor.

* * * * *